United States Patent
Pennec

(10) Patent No.: US 7,554,395 B1
(45) Date of Patent: Jun. 30, 2009

(54) AUTOMATIC LOW BATTERY COMPENSATION SCALING ACROSS MULTIPLE POWER AMPLIFIER STAGES

(75) Inventor: Christian Pennec, Cupertino, CA (US)

(73) Assignee: Panasonic Corporation, Osaka (JP)

( * ) Notice: Subject to any disclaimer, the term of this patent is extended or adjusted under 35 U.S.C. 154(b) by 104 days.

(21) Appl. No.: 11/823,891

(22) Filed: Jun. 28, 2007

(51) Int. Cl.
*H03G 3/20* (2006.01)

(52) U.S. Cl. .................... 330/133; 330/134

(58) Field of Classification Search ............. 330/133, 330/134, 285
See application file for complete search history.

(56) References Cited

U.S. PATENT DOCUMENTS

| | | | |
|---|---|---|---|
| 4,355,303 A | 10/1982 | Phillips et al. | 340/310 A |
| 4,503,398 A * | 3/1985 | Akram | 330/285 |
| 5,079,497 A | 1/1992 | Barbu et al. | 323/381 |
| 5,175,879 A | 12/1992 | Ellingson et al. | 455/341 |
| 5,302,913 A | 4/1994 | Hori | 330/129 |
| 5,432,473 A * | 7/1995 | Mattila et al. | 330/133 |
| 5,548,205 A | 8/1996 | Monticelli | 323/274 |
| 5,564,087 A | 10/1996 | Cygan et al. | 455/126 |
| 5,589,796 A * | 12/1996 | Alberth et al. | 330/133 |
| 5,831,477 A * | 11/1998 | Tsumura | 330/51 |
| 5,942,946 A * | 8/1999 | Su et al. | 330/310 |
| 6,173,056 B1 * | 1/2001 | Romesburg et al. | 379/406.01 |
| 6,236,266 B1 * | 5/2001 | Choumei et al. | 330/133 |
| 6,351,189 B1 * | 2/2002 | Hirvilampi | 330/296 |
| 6,430,402 B1 * | 8/2002 | Agahi-Kesheh | 455/115.3 |
| 6,528,975 B2 | 3/2003 | Sander | 323/281 |
| 6,639,466 B2 * | 10/2003 | Johnson | 330/149 |
| 6,651,021 B2 * | 11/2003 | Underbrink et al. | 702/107 |
| 6,882,220 B2 * | 4/2005 | Doherty et al. | 330/133 |
| 7,091,790 B2 * | 8/2006 | Doherty et al. | 330/297 |
| 7,123,095 B2 * | 10/2006 | Tsutsui et al. | 330/285 |
| 7,193,471 B2 * | 3/2007 | Tsutsui et al. | 330/285 |

* cited by examiner

*Primary Examiner*—Steven J Mottola

(57) ABSTRACT

An amplification circuit and scaling method are configured to apply optimum biasing characteristics such that a multistage power amplifier operates according to defined performance characteristics. The operating conditions of the multistage amplifier are optimized by applying independent bias voltages to each stage within the multistage amplifier while operating in a maximum power output range. To achieve optimum or near-optimum operating conditions, each bias voltage is independently scaled according to a specific power output level.

20 Claims, 5 Drawing Sheets

AUTOMATIC LOW BATTERY COMPENSATION SCALING ACROSS MULTIPLE POWER AMPLIFIER STAGES

FIELD OF THE INVENTION

The present invention relates to multistage amplifiers. More particularly, the present invention relates to scaling bias voltages applied to multistage amplifiers.

BACKGROUND OF THE INVENTION

In the communications field, it is an objective to generate communications signals with low distortion. Particularly in wireless communications, distortion is minimized in order to avoid adjacent channel interference. A principle cause of distortion in wireless communications is saturation of a driver circuit transistor, resulting in signal clipping.

U.S. Pat. No. 6,528,975 describes a saturation prevention circuit including a linear amplifier for avoiding saturation of the driver circuit. Although effective at minimizing saturation of a driver circuit, the saturation prevention circuit does not address the complexities associated with maintaining certain performance specifications within a multi-stage amplifier while preventing saturation.

SUMMARY OF THE INVENTION

An amplification circuit and scaling method are configured to apply optimum biasing characteristics such that a multistage power amplifier operates according to defined performance characteristics. The operating conditions of the multistage amplifier are optimized by applying independent bias voltages to each stage within the multistage amplifier while operating in a maximum power output range. To achieve optimum or near-optimum operating conditions, each bias voltage is independently scaled according to a specific power output level. In some embodiments, the relationship between the specific output power level and the corresponding optimum bias voltage for a given stage is defined according to a voltage function. In other embodiments, the relationship between the specific output power level and the corresponding optimum bias voltage for a given stage is defined within a look-up table.

In an aspect, a machine comprises a multistage amplifier, a plurality of driver circuits, each driver circuit coupled to a corresponding stage within the multistage amplifier, wherein each driver circuit is configured to provide a bias voltage to the corresponding stage and a control circuit configured to independently control each bias voltage, wherein each bias voltage is independently adjusted to a specified value corresponding to a current output power level of the multistage amplifier, thereby maintaining one or more defined performance characteristics of the multistage amplifier. The machine further comprises a detection circuit configured to detect onset of saturation within a final stage driver circuit, wherein the final stage driver circuit is coupled to a final stage within the multistage amplifier. The control circuit is further configured to scale back each of the bias voltages upon detecting onset of saturation by the detection circuit, thereby scaling back the output power level of the multistage amplifier to a scaled back output power level, wherein each of the bias voltages is scaled back to the specific value corresponding to the scaled back output power level. One of the performance characteristics is a spectrum specification of a signal output from the multistage amplifier. In some embodiments, a relationship between each bias voltage varies with changing output power level. In some embodiments, each bias voltage is defined by a corresponding voltage function that varies with the output power level such that for a specific output power level value a specific value for each bias voltage is determined as defined by each corresponding voltage function. In some embodiments, a relationship between each output power level and each bias voltage corresponding to a specific output power level is defined by a look-up table. In some embodiments, each bias voltage comprises a constant amplitude modulation. In some embodiments, each bias voltage comprises an amplitude modulation including an offset and an amplitude range defined by a bias voltage maximum and a bias voltage minimum. In some embodiments, the offset and the amplitude range decrease with decreasing output power level.

In another aspect, a method comprises defining a set of optimum bias voltages for each output power level, wherein each bias voltage is to be applied to a corresponding stage within a multistage amplifier, further wherein for a specific output power level, the multistage amplifier operates according to one or more defined performance characteristics in response to the corresponding set of optimum bias voltages, applying each bias voltage to the corresponding stage within the multistage amplifier and independently adjusting each bias voltage according to a current output power level of the multistage amplifier and the corresponding optimum bias voltages, thereby maintaining the one or more defined performance characteristics of the multistage amplifier. The method further comprises monitoring for onset of a saturation condition. In some embodiments, upon detecting onset of the saturation condition, scaling back each of the bias voltages, thereby scaling back the output power level of the multistage amplifier to a scaled back output power level, wherein each of the bias voltages is scaled back according to the set of optimum bias voltages corresponding to the scaled back output power level. In some embodiments, one of the performance characteristics is a spectrum specification of a signal output from the multistage amplifier. In some embodiments, a relationship between each bias voltage varies with changing output power level. In some embodiments, defining the set of optimum bias voltages for each output power level comprises defining a corresponding voltage function for each bias voltage that varies with the output power level such that for a specific output power level value a specific value for each bias voltage is determined as defined by each corresponding voltage function. In some embodiments, defining the set of optimum bias voltages for each output power level comprises defining a look-up table that includes a relationship between each output power level and each optimum bias voltage corresponding to a specific output power level. In some embodiments, the method further comprises modulating each bias voltage according to a constant amplitude modulation. In some embodiments, the method further comprises modulating each bias voltage according to an amplitude modulation that includes an offset and an amplitude range defined by a bias voltage maximum and a bias voltage minimum. In some embodiments, the offset and the amplitude range decrease with decreasing output power level.

BRIEF DESCRIPTION OF THE SEVERAL VIEWS OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION

Embodiments of the present invention are directed to selectively provide bias voltages to a multistage amplifier in order to maintain defined performance characteristics. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the present invention are directed to an apparatus for and a method of preventing saturation of transistors used in an amplification circuit including a multistage power amplifier. In general, an amplification circuit and scaling method are configured to exploit the optimum biasing characteristics of a multistage power amplifier. The operating conditions of the multistage amplifier are optimized by applying independent bias voltages to each stage within the multistage amplifier while operating in a maximum power output range. To achieve optimum or near-optimum operating conditions, each bias voltage is independently scaled according to a specific power output level. Such optimization is particularly useful for maintaining defined performance characteristics upon detection of a saturation condition and subsequent power output back-off. The scaling method described herein can be applied to any conventional type of amplifier, including but not limited to a linear amplifier and a switched mode amplifier.

In some applications, the spectrum performance of a mobile transmitter is maintained, while the battery is depleting. In this case, an automatic low battery compensation (ALBC) method is applied to adapt the individual bias voltage operating points provided to each stage within the multistage power amplifier.

Figure 1:
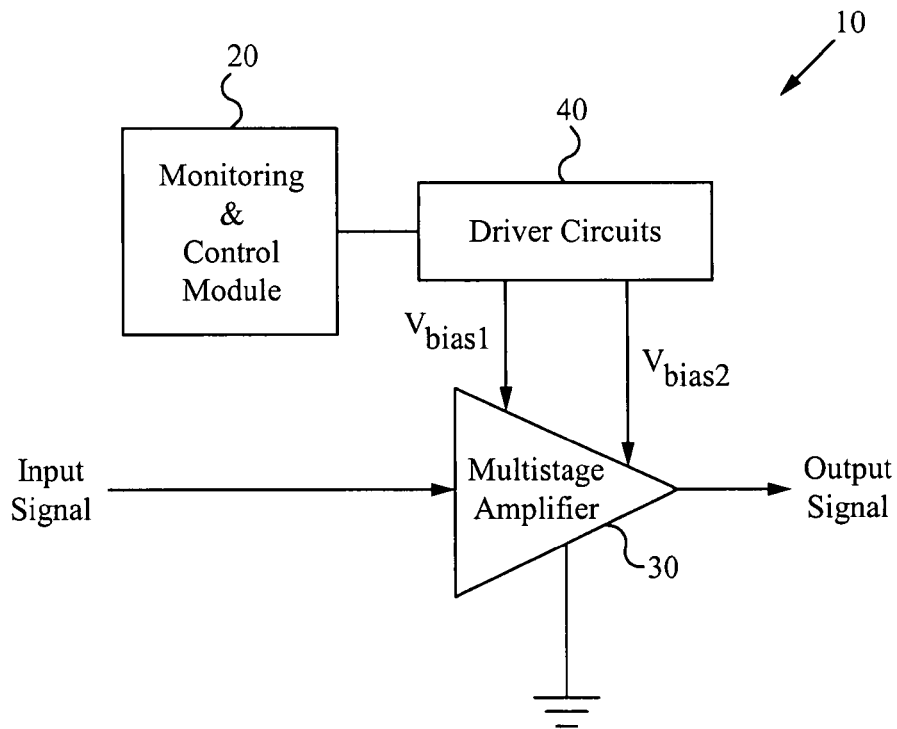
FIG. 1 illustrates a block diagram of an exemplary amplifying circuit.

FIG. 1 illustrates a block diagram of an exemplary amplifying circuit 10. The amplifying circuit 10 includes a monitoring and control module 20, a multistage amplifier 30, and driver circuits 40. The driver circuits 40 are configured to provide a plurality of independently controllable bias voltages, each bias voltage is applied to one stage of the multistage amplifier 30. In the exemplary configuration of FIG. 1, the multistage amplifier 30 includes two stages, a driver stage and a final stage, and the driver circuits 40 include two driver circuits, a first driver circuit configured to generate the bias voltage $V_{bias1}$ and a second driver circuit configured to generate the bias voltage $V_{bias2}$. The driver circuits 40 generate the bias voltages according to control signals provided by the monitoring and control module 20.

The amplifying circuit 10 receives an input signal and outputs a corresponding amplified output signal. In some embodiments, the input signal is an RF input signal, and the output signal is an RF output signal. The input signal is input to the multistage amplifier 30 and is amplified according to the two bias voltages, the bias voltage $V_{bias1}$ and the bias voltage $V_{bias2}$, provided by the driver circuits 40. The driver circuits 40 generate the bias voltage $V_{bias1}$ and the bias voltage $V_{bias2}$ in response to control signals provided by the monitoring and control module 20. The monitoring and control module 20 includes a table of desired performance characteristics for the multistage amplifier, and the specific bias voltages to be applied to each specific stage within the multistage amplifier 30 in order to achieve the desired performance characteristics. In particular, an optimum set of bias voltages, one bias voltage for each stage in the multistage amplifier 30, is defined for each specific output power level of the multistage amplifier 30. To increase or decrease the power output level of the multistage amplifier 30 to a specific output power level, while maintaining the desired performance characteristics, the monitoring and control module 20 provides control signals to the driver circuits 40 to generate the optimum bias voltages corresponding to the specific power output level.

The monitoring and control module 20 also monitors the status of the transistors (not shown) included within the driver circuits 40 to detect the onset of a saturation condition. It is understood that any conventional means for detecting the onset of a saturation condition can be used by the monitoring and control module 20 including, but not limited to, the use of current monitors, threshold comparators, and/or voltage comparators. An exemplary method of detecting the onset of saturation is described in U.S. Pat. No. 6,528,975. Upon detection of the saturation condition, a back-off signal is generated by the monitoring and control module 20. The back-off signal indicates reduced values for the bias voltages, which results in a reduced output power level. As with any specific output power level, the corresponding bias voltage are optimized so that the multistage amplifier 30 maintains the desired performance characteristics.

Figure 2:
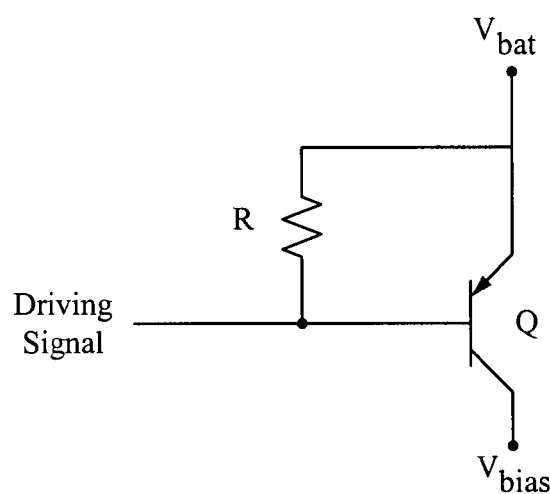
FIG. 2 illustrates an exemplary circuit configuration of a driver circuit.

FIG. 2 illustrates an exemplary circuit configuration of a driver circuit. A separate driver circuit is used to generate the bias voltage $V_{bias1}$ and the bias voltage $V_{bias2}$ driving voltages applied to each stage within the multistage amplifier 30 (FIG. 1). A transistor Q is provided with a supply voltage $V_{bat}$ and the driving signal provided by the monitoring and control module 20 (FIG. 1). In response, the transistor Q outputs a bias voltage $V_{bias}$, which is provided as either the bias voltage $V_{bias1}$ or the bias voltage $V_{bias2}$ to the multistage amplifier 30 (FIG. 1). In some embodiments, the supply voltage $V_{bat}$ is provided by a battery, such as in a mobile communications device. Resistor R is representative of a resistive network that includes one or more resistors. In the case of feedback control, the resistor R also includes the resistive effect of any resistive network coupled to the output of the transistor Q. The transistor Q included in the driving circuit of FIG. 2 is a bipolar transistor. Alternatively, the transistor Q can be any type of conventional transistor.

Figure 3:
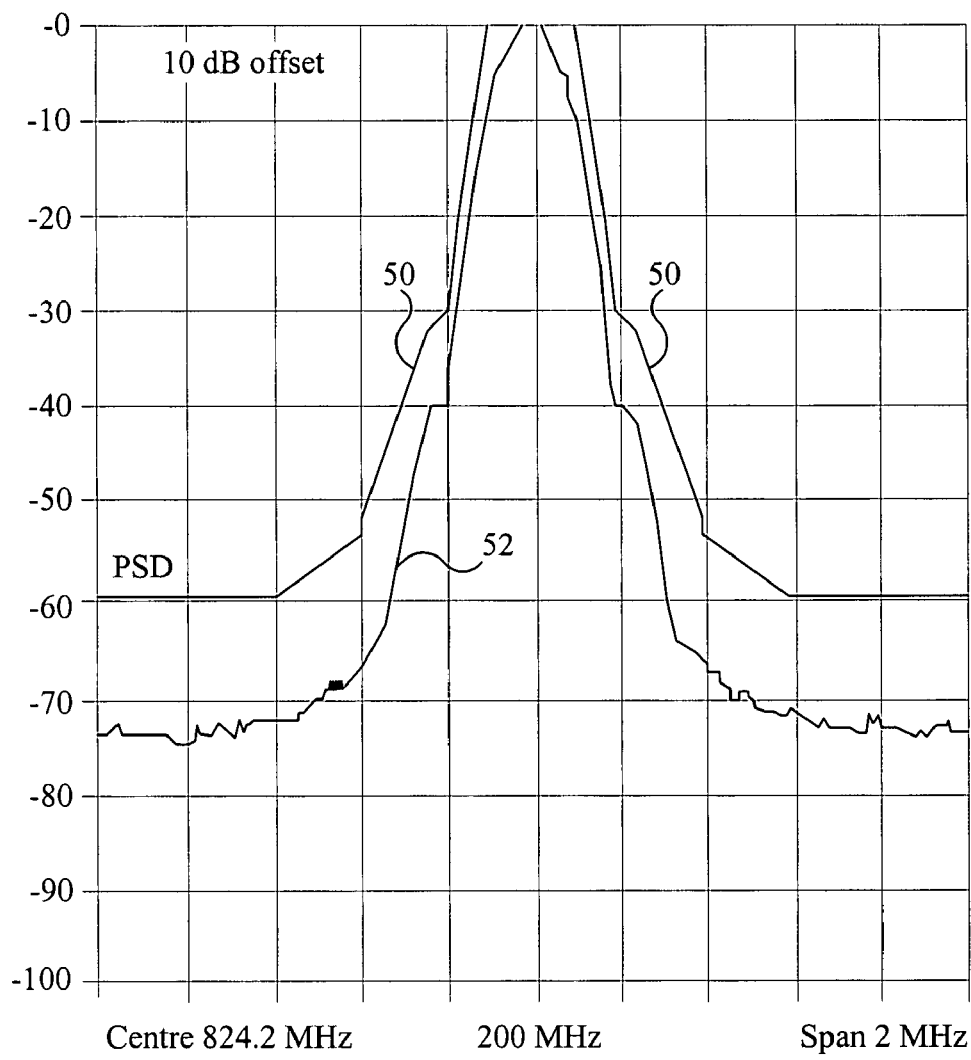
FIG. 3 illustrates a graph of exemplary spectrum characteristics corresponding to a GMSK modulated signal.

For a given output power level, the multistage amplifier has an optimized set of bias voltages, for which the output signal exhibits an optimized performance as defined by specific performance characteristics. It is of particular interest for modulated signals, for which spectrum frequency characteristics must meet specific requirements in term of bandwidth and maximum permitted level at specific frequency offsets away from the carrier. FIG. 3 illustrates a graph of exemplary spectrum characteristics corresponding to a GMSK modulated signal. The curve 50 represents the spectrum specifications for a GMSK modulated signal. The curve 52 represents an exemplary GMSK modulated signal. Any GMSK modulated signal formed within the curve 50, as does the curve 52, is said to perform within the specification.

The optimized bias voltage conditions are charted across a power output dynamic range. An exemplary application of the scaling method includes using optimized bias voltage characteristics upon detection of a saturation condition. When the saturation condition is detected, the bias voltages applied to each stage of the multistage amplifier are reduced. Reducing each bias voltage to an optimized value not only provides the power adjustment required to avoid transistor saturation, but also ensures that any power output is obtained with optimum performance as defined by specific performance characteristics. Although the application of the scaling method described herein is related to scaling back the power output level upon onset of saturation, the scaling method can be generalized so as to increase or decrease the applied optimized bias voltages according to a desired increased or decreased output power level.

Figure 4:
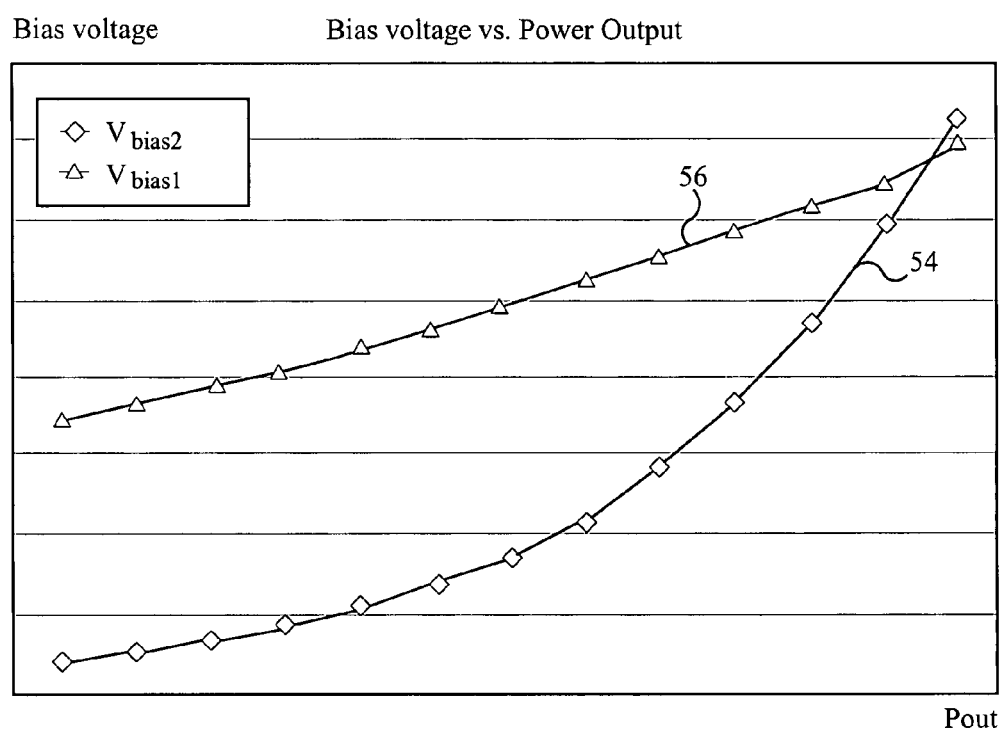
FIG. 4 illustrates an exemplary bias voltage versus power output graph for optimized bias conditions.

FIG. 4 illustrates an exemplary bias voltage versus power output graph for optimized bias conditions. A voltage function curve 54 provides an optimized bias voltage $V_{bias2}$ for each specific power output level Pout. A voltage function curve 56 provides an optimized bias voltage $V_{bias1}$ for each specific power output level Pout. Applying the optimized bias voltage $V_{bias1}$ and the optimized bias voltage $V_{bias2}$ for a specific power output level results in the multistage amplifier operating with the desired performance characteristics, such as the spectrum specification described in relation to FIG. 3. The voltage function curve 56 and the voltage function curve 54 provide a relationship between the bias voltage $V_{bias1}$ and the bias voltage $V_{bias2}$ for each specific power output level Pout. To lower the power output level Pout of the multistage amplifier, such as at the onset of saturation, the bias voltage $V_{bias2}$ applied to the final stage of the multistage amplifier is reduced to a value corresponding to the reduced power output level and in accordance with the voltage function curve 54. To maintain the desired performance characteristics of the multistage amplifier, the bias voltage $V_{bias1}$ is also lowered, but is lowered in accordance with the voltage function curve 56. The form of the voltage functions curve 54 and the form of the voltage function curve 56 shown in FIG. 4 are for exemplary purposes only. It is understood that the voltage function curve 54 and the voltage function curve 56 can be represented by other functions. Alternatively, the bias voltage $V_{bias1}$ and the bias voltage $V_{bias2}$ for each power output level can be defined in a look-up table or other conventional means for defining a specific bias voltage $V_{bias1}$ and a specific bias voltage $V_{bias2}$ for each specific power output level.

The bias voltage versus power output graph shown in FIG. 4 applies to a switched mode amplifier in which a constant amplitude is applied via the bias voltages. The constant amplitude can be applied continuously, as in continuous wave modulation, or can be constant for an active period of time, as in TDMA. In another application, the scaling method is applied to a switched multistage power amplifier, where an amplitude modulation in applied to each stage bias voltage.

As with the amplifier application described in relation to FIG. 4, the optimized bias voltages applied to each stage of the switched multistage amplifier vary with changing power output levels. Application of amplitude modulation results in bias voltages that vary within an amplitude range for a given output power level. The amplitude range is bounded by a maximum value, referred to as a bias voltage maximum $V_{bias}$ Max, and a minimum value, referred to as a bias voltage minimum $V_{bias}$ Min. Depending on the power amplifier technology and topology, the optimum operation is obtained with a specific combination of amplitude modulation and DC offset. Each bias voltage is independently defined by a specific amplitude modulation and DC offset for each specific power output level. Application of the scaling method includes scaling both the variable part of the amplitude modulation, as defined by the amplitude range, and the DC offset. The amplitude range is defined by the bias voltage maximum $V_{bias}$ Max minus the bias voltage minimum $V_{bias}$ Min. The DC offset is defined as the bias voltage minimum $V_{bias}$ Min. For each specific output power level, a specific bias voltage including a specific optimum amplitude range and DC offset is defined for each stage in the multistage amplifier.

Figure 5:
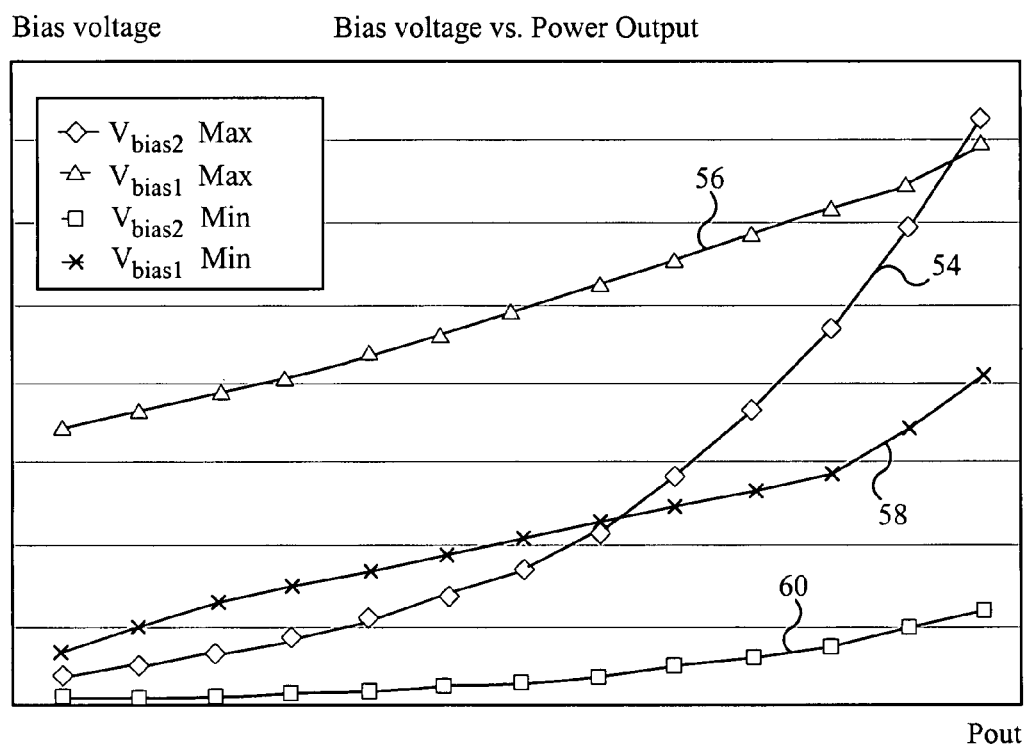
FIG. 5 illustrates an exemplary bias voltage versus power output graph for optimized bias conditions, where the bias voltages include amplitude modulation.

FIG. 5 illustrates an exemplary bias voltage versus power output graph for optimized bias conditions, where the bias voltages include amplitude modulation. The voltage function curve 54 is the same as in FIG. 4, and in this application represents the optimized maximum bias voltage $V_{bias2}$ Max. The voltage function curve 56 is the same as in FIG. 4, and in this application represents the optimized maximum bias voltage $V_{bias1}$ Max. A voltage function curve 58 provides an optimized minimum bias voltage $V_{bias1}$ Min for each specific power output level Pout. A voltage function curve 60 provides an optimized minimum bias voltage $V_{bias2}$ Min for each specific power output level Pout.

The DC offset for the bias voltage $V_{bias1}$ is the minimum bias voltage $V_{bias1}$ Min, and the amplitude range for the bias voltage $V_{bias1}$ is the maximum bias voltage $V_{bias1}$ Max minus the minimum bias voltage $V_{bias1}$ Min. Similarly, the DC offset for the bias voltage $V_{bias2}$ is the minimum bias voltage $V_{bias2}$ Min, and the amplitude range for the bias voltage $V_{bias2}$ is the maximum bias voltage $V_{bias2}$ Max minus the minimum bias voltage $V_{bias2}$ Min. There is a distinct DC offset and amplitude range for each bias voltage at each specific power output level Pout. The second stage within the multistage amplifier operates within the bias voltage $V_{bias2}$ Max and the bias voltage $V_{bias2}$ Min for a given output power level Pout. The defined performance characteristics are obtained when the bias voltage $V_{bias1}$ applied to the first stage of the multistage amplifier is within a corresponding range defined by the bias voltage $V_{bias1}$ Max minus the bias voltage $V_{bias1}$ Min for the same given output power level Pout. If the amplitude range and/or the DC offset do not match the defined optimum values, the multistage amplifier does not operate according to the desired performance characteristics. For example, if the optimum amplitude range is applied but a non-optimum DC offset is applied, then the result on the output spectrum tends to distort. As such, the minimum bias voltage $V_{bias}$ Min, which is also the optimum DC offset, is determined as the bias voltage value where the output spectrum is well balanced about the center frequency and within the performance specifications.

In the exemplary case shown in FIG. 5, the amplitude range for the bias voltage $V_{bias1}$ is smaller than the amplitude range for the bias voltage $V_{bias2}$ at high output power levels. As such, the same amplitude swing is not applied at the first stage of the multistage amplifier as at the second stage. As is also shown in FIG. 5, the range of amplitude modulation and the DC offset each decrease with decreasing power output levels.

To lower the power output level Pout of the multistage amplifier, such as at the onset of saturation, the DC offset and the amplitude range of the bias voltage $V_{bias2}$ applied to the final stage of the multistage amplifier are reduced to values corresponding to the reduced power output level. As applied to FIG. 5, the DC offset is set according to the curve 60 and the amplitude range is set according to the curves 54 and 60. To maintain the desired performance characteristics of the multistage amplifier, the DC offset and the amplitude range of the bias voltage $V_{bias1}$ is also lowered, but is lowered in accordance with the voltage function curves 56 and 58.

Figure 6:
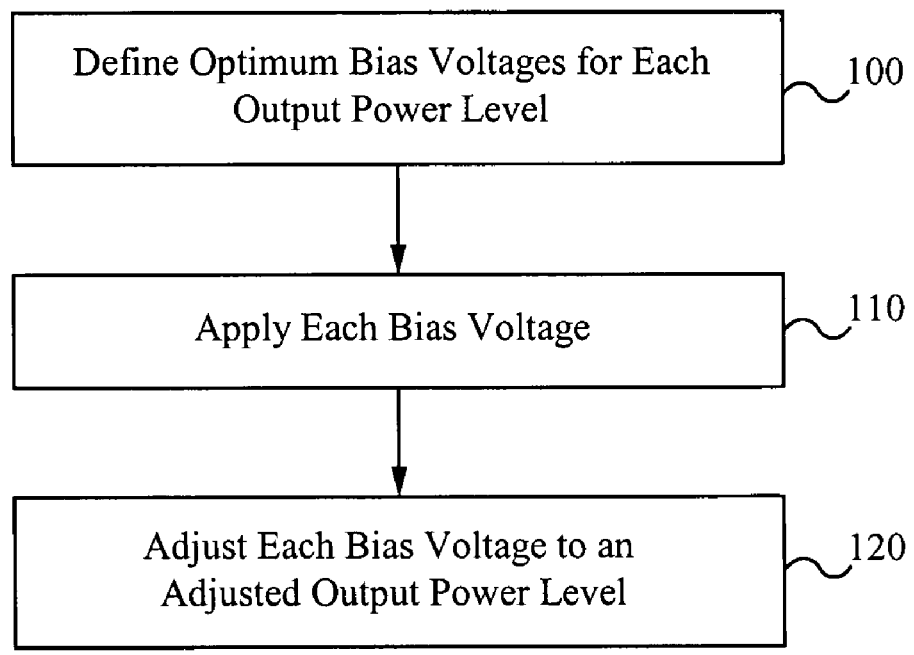
FIG. 6 illustrates an exemplary scaling method for applying and adjusting optimized bias voltages to each stage of a multistage amplifier.

FIG. 6 illustrates an exemplary scaling method for applying and adjusting optimized bias voltages to each stage of a multistage amplifier. At the step 100, define a set of optimum bias voltages for each output power level. Each bias voltage is to be applied to a corresponding stage within a multistage amplifier such that for a specific output power level, the multistage amplifier operates according to one or more defined performance characteristics in response to the corresponding set of optimum bias voltages. At the step 110, apply each bias voltage to the corresponding stage within the multistage amplifier. At the step 120, independently adjust each bias voltage according to a current output power level of the multistage amplifier and the corresponding optimum bias voltages. Adjusting each bias voltage to the optimum bias voltages maintains the one or more defined performance characteristics of the multistage amplifier.

Although the multistage amplifier is described above as a two-stage amplifier, it is understood that the scaling method can be applied to a multistage amplifier that includes more than two stages. In general, the multistage amplifier can be an N-stage amplifier, in which case N separate bias voltages are supplied by the driver circuits.

The present application has been described in terms of specific embodiments incorporating details to facilitate the understanding of the principles of construction and operation of the power amplification circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed:

1. A machine comprising:
   a. a multistage amplifier;
   b. a plurality of driver circuits, each driver circuit coupled to a corresponding stage within the multistage amplifier, wherein each driver circuit is configured to provide a bias voltage to the corresponding stage; and
   c. a control circuit configured to independently control each bias voltage, wherein each bias voltage is independently adjusted to a specified value corresponding to a current output power level of the multistage amplifier, thereby maintaining one or more defined performance characteristics of the multistage amplifier.

2. The machine of claim 1 further comprising a detection circuit configured to detect onset of saturation within a final stage driver circuit, wherein the final stage driver circuit is coupled to a final stage within the multistage amplifier.

3. The machine of claim 2 wherein the control circuit is further configured to scale back each of the bias voltages upon detecting onset of saturation by the detection circuit, thereby scaling back the output power level of the multistage amplifier to a scaled back output power level, wherein each of the bias voltages is scaled back to the specific value corresponding to the scaled back output power level.

4. The machine of claim 1 wherein one of the performance characteristics is a spectrum specification of a signal output from the multistage amplifier.

5. The machine of claim 1 wherein a relationship between each bias voltage varies with changing output power level.

6. The machine of claim 1 wherein each bias voltage is defined by a corresponding voltage function that varies with the output power level such that for a specific output power level value a specific value for each bias voltage is determined as defined by each corresponding voltage function.

7. The machine of claim 1 wherein a relationship between each output power level and each bias voltage corresponding to a specific output power level is defined by a look-up table.

8. The machine of claim 1 wherein each bias voltage comprises a constant amplitude modulation.

9. The machine of claim 1 wherein each bias voltage comprises an amplitude modulation including an offset and an amplitude range defined by a bias voltage maximum and a bias voltage minimum.

10. The machine of claim 9 wherein the offset and the amplitude range decrease with decreasing output power level.

11. A method comprising:
   a. defining a set of optimum bias voltages for each output power level, wherein each bias voltage is to be applied to a corresponding stage within a multistage amplifier, further wherein for a specific output power level, the multistage amplifier operates according to one or more defined performance characteristics in response to the corresponding set of optimum bias voltages;
   b. applying each bias voltage to the corresponding stage within the multistage amplifier; and
   c. independently adjusting each bias voltage according to a current output power level of the multistage amplifier and the corresponding optimum bias voltages, thereby maintaining the one or more defined performance characteristics of the multistage amplifier.

12. The method of claim 11 further comprising monitoring for onset of a saturation condition.

13. The method of claim 12 wherein upon detecting onset of the saturation condition, scaling back each of the bias voltages, thereby scaling back the output power level of the multistage amplifier to a scaled back output power level, wherein each of the bias voltages is scaled back according to the set of optimum bias voltages corresponding to the scaled back output power level.

14. The method of claim 11 wherein one of the performance characteristics is a spectrum specification of a signal output from the multistage amplifier.

15. The method of claim 11 wherein a relationship between each bias voltage varies with changing output power level.

16. The method of claim 11 wherein defining the set of optimum bias voltages for each output power level comprises defining a corresponding voltage function for each bias voltage that varies with the output power level such that for a specific output power level value a specific value for each bias voltage is determined as defined by each corresponding voltage function.

17. The method of claim 11 wherein defining the set of optimum bias voltages for each output power level comprises defining a look-up table that includes a relationship between each output power level and each optimum bias voltage corresponding to a specific output power level.

18. The method of claim 11 further comprising modulating each bias voltage according to a constant amplitude modulation.

19. The method of claim 11 further comprising modulating each bias voltage according to an amplitude modulation that includes an offset and an amplitude range defined by a bias voltage maximum and a bias voltage minimum.

20. The method of claim 19 wherein the offset and the amplitude range decrease with decreasing output power level.

* * * * *